(12) United States Patent
Chen et al.

(10) Patent No.: US 8,525,153 B2
(45) Date of Patent: Sep. 3, 2013

(54) STRUCTURE INCLUDING VOLTAGE CONTROLLED NEGATIVE RESISTANCE

(75) Inventors: Fen Chen, Williston, VT (US); Elbert E. Huang, Carmel, NY (US); Michael A. Shinosky, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 42 days.

(21) Appl. No.: 13/323,514

(22) Filed: Dec. 12, 2011

(65) Prior Publication Data
US 2013/0146940 A1 Jun. 13, 2013

(51) Int. Cl.
*H01L 29/06* (2006.01)
(52) U.S. Cl.
USPC .............................. 257/30; 257/758
(58) Field of Classification Search
USPC .......................... 257/30, 758, 767
See application file for complete search history.

(56) References Cited

U.S. PATENT DOCUMENTS

| | | | |
|---|---|---|---|
| 6,835,967 B2 | 12/2004 | Yeo et al. | |
| 7,700,466 B2 | 4/2010 | Booth, Jr. et al. | |
| 8,203,875 B2 * | 6/2012 | Amin et al. | 365/175 |
| 2002/0089005 A1 | 7/2002 | Wickramasinghe et al. | |
| 2008/0089005 A1 | 4/2008 | Choi et al. | |

* cited by examiner

*Primary Examiner* — Mark Prenty
(74) *Attorney, Agent, or Firm* — Anthony J. Canale; Hoffman Warnick LLC

(57) ABSTRACT

Aspects of the invention provide a semiconductor tunneling device including voltage controlled negative resistance. In one embodiment, the semiconductor tunneling device includes: at least one pair of spaced apart terminals; an inter-level dielectric (ILD) layer between the at least one pair of spaced apart terminals; and a dielectric capping layer extending continuously over the at least one pair of spaced apart terminals and the ILD layer.

20 Claims, 8 Drawing Sheets

STRUCTURE INCLUDING VOLTAGE CONTROLLED NEGATIVE RESISTANCE

FIELD OF THE INVENTION

The disclosure relates generally to integrated circuit (IC) chips and fabrication, and more particularly, to a design structure including voltage controlled negative resistance and a semiconductor structure.

BACKGROUND

Negative resistance occurs when an increase in the current entering a circuit results in a decrease in voltage. Under Ohm's Law, which states that the amount of electric current through a metal conductor in a circuit is directly proportional to the voltage impressed across it, negative resistance is theoretical and does not exist as a discrete component.

New quantum electronic devices that exhibit negative resistance characteristics are of great interest for high-speed, high-density integrated circuits (ICs) which have less interconnection complexity. The high intrinsic switching speed, intrinsic binary on-off state, combined with novel circuit structures, could lead to fast, compact, and low-cost future products.

BRIEF SUMMARY

A first aspect of the disclosure provides a semiconductor tunneling device, comprising: at least one pair of spaced apart terminals; an inter-level dielectric (ILD) layer between the at least one pair of spaced apart terminals; and a dielectric capping layer extending continuously over the at least one pair of spaced apart terminals and the ILD layer.

A second aspect of the disclosure provides a semiconductor tunneling device, comprising: at least one pair of spaced apart copper terminals; an inter-level dielectric (ILD) layer between the at least one pair of spaced apart terminals; and a hydrogen doped silicon carbide capping layer extending continuously over the at least one pair of spaced apart terminals and the ILD layer.

A third aspect of the disclosure provides a design structure tangibly embodied in a machine readable medium for designing, manufacturing, or testing an integrated circuit, the design structure comprising: at least one pair of spaced apart copper terminals; an inter-level dielectric (ILD) layer between the at least one pair of spaced apart terminals; and a dielectric capping layer extending continuously over the at least one pair of spaced apart terminals and the ILD layer.

BRIEF DESCRIPTION OF THE DRAWINGS

The above and other aspects, features and advantages of the disclosure will be better understood by reading the following more particular description of the disclosure in conjunction with the accompanying drawings.

Figure 1:
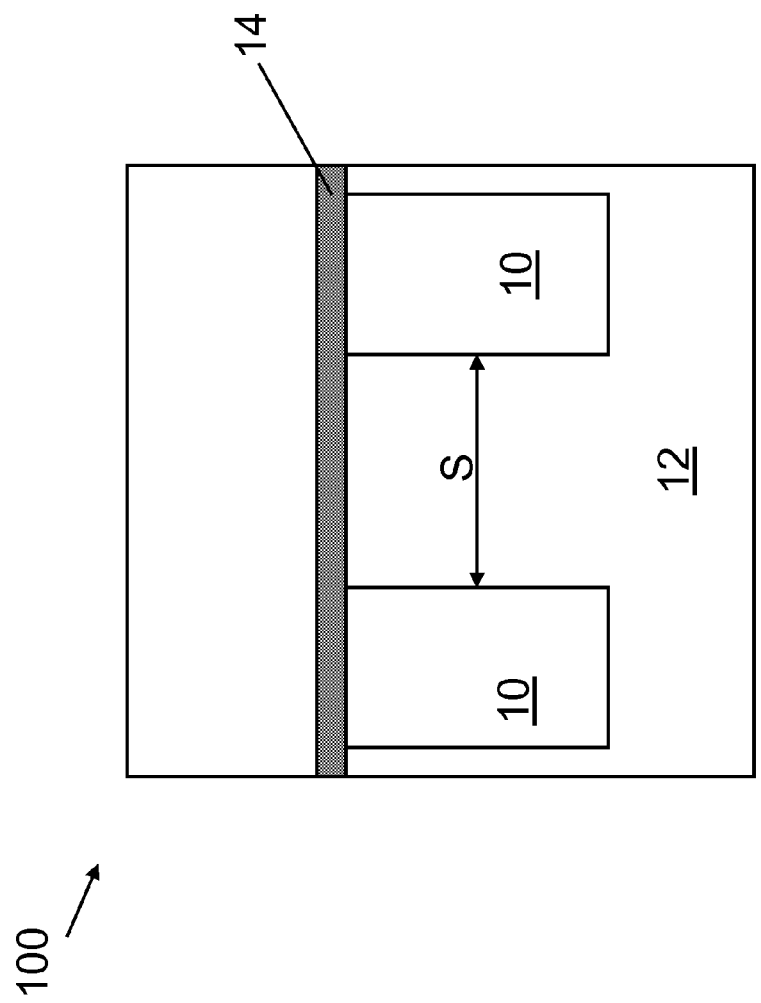
FIG. 1 shows a cross-sectional side view of portions of a semiconductor tunneling device according to embodiments of the invention.

The drawings are not necessarily to scale. The drawings are merely schematic representations, not intended to portray specific parameters of the disclosure. The drawings are intended to depict only typical embodiments of the disclosure, and therefore should not be considered as limiting the scope of the disclosure. In the drawings, like numbering represents like elements.

DETAILED DESCRIPTION

The disclosure relates generally to integrated circuit (IC) chips and fabrication, and more particularly, to a design structure including voltage controlled negative resistance.

Negative resistance occurs when an increase in the current entering a circuit results in a decrease in voltage. Under Ohm's Law, which states that the amount of electric current through a metal conductor in a circuit is directly proportional to the voltage impressed across it, only positive resistance can exist in a discrete component. Negative resistance is theoretical and does not exist as a discrete component.

However, new quantum electronic devices that exhibit negative resistance characteristics are of great interest for high-speed, high-density integrated circuits (ICs) which have less interconnection complexity. The high intrinsic switching speed, intrinsic binary on-off state, combined with novel circuit structures, could lead to fast, compact, and low-cost future products.

Aspects of the invention provide a semiconductor tunneling device including voltage controlled negative resistance. In one embodiment, the semiconductor tunneling device includes: at least one pair of spaced apart terminals; an inter-level dielectric (ILD) layer between the at least one pair of spaced apart terminals; and a dielectric capping layer extending continuously over the at least one pair of spaced apart terminals and the ILD layer. As will be mentioned herein, the interface between the dielectric capping layer and the spaced apart terminals and the interface between the dielectric capping layer and the ILD layer are the interfaces that produce the negative resistance characteristics in the semiconductor tunneling device by allowing the material of the spaced apart terminals to migrate. In contrast, conventional structures seek to avoid this migration/diffusion by not including these two interfaces. By being able to control the voltage at which negative resistance occurs, the leakage current in the semiconductor tunneling device may be reduced at that voltage.

Turning now to FIG. 1, a cross-sectional view of a semiconductor tunneling device 100 according to embodiments of the invention is shown. In this embodiment, semiconductor tunneling device 100 may be, for example, a diode. Semiconductor tunneling device 100 includes at least one pair of spaced apart terminals 10. The pair of spaced apart terminals 10 may be spaced apart approximately 1 nanometer to approximately 100 nanometers. As will be mentioned herein, the spacing S of the terminals 10 provided for voltage-control of the negative resistance characteristics of the semiconductor tunneling device 100. Each terminal 10 includes a conductive material, such as, for example, copper. However, it is understood that terminal 10 may include any other conductive material, as known in the art.

An inter-level dielectric (ILD) layer 12 is between the pair of spaced apart terminals 10. The ILD layer 12 may include any now known or later developed dielectric material, as known in the art. However, it is understood that the dielectric material of ILD layer 12 includes a dielectric material that has a dielectric constant of approximately 4 or less.

A dielectric capping layer 14 extends continuously over the pair of spaced apart terminals 10 and the ILD layer 12. A thickness of the dielectric capping layer 14 may be approximately 2 nanometers to approximately 5 nanometers. The dielectric capping layer 14 may include any now known or later developed dielectric material, such as, for example, hydrogen doped silicon carbide. However, it is understood that the dielectric capping layer 14 may include any other dielectric material that has a poor barrier function to block the conductive material of the pair of spaced apart terminals 10 to migrate. This migration is what causes negative resistance characteristics to occur. The dielectric capping layer 14 provides a tunneling path for the material of the terminals 10 to diffuse between each terminal 10.

As mentioned above, the spacing S of the pair of spaced apart terminals 10 may be approximately 1 nanometer to approximately 100 nanometers. The spacing S of the pair of spaced apart terminals 10 is directly proportional to the voltage at which negative resistance occurs in the semiconductor tunneling device 100. That is, the voltage at which negative resistance occurs increases as the spacing S between the terminals 10 increases. Therefore, the negative resistance of the semiconductor tunneling device 100 may be controlled by the spacing S of the spaced apart terminals 10. Further, as the temperature increases, the voltage at which negative resistance characteristics are exhibited by the semiconductor tunneling device 100 decreases.

Figure 2:
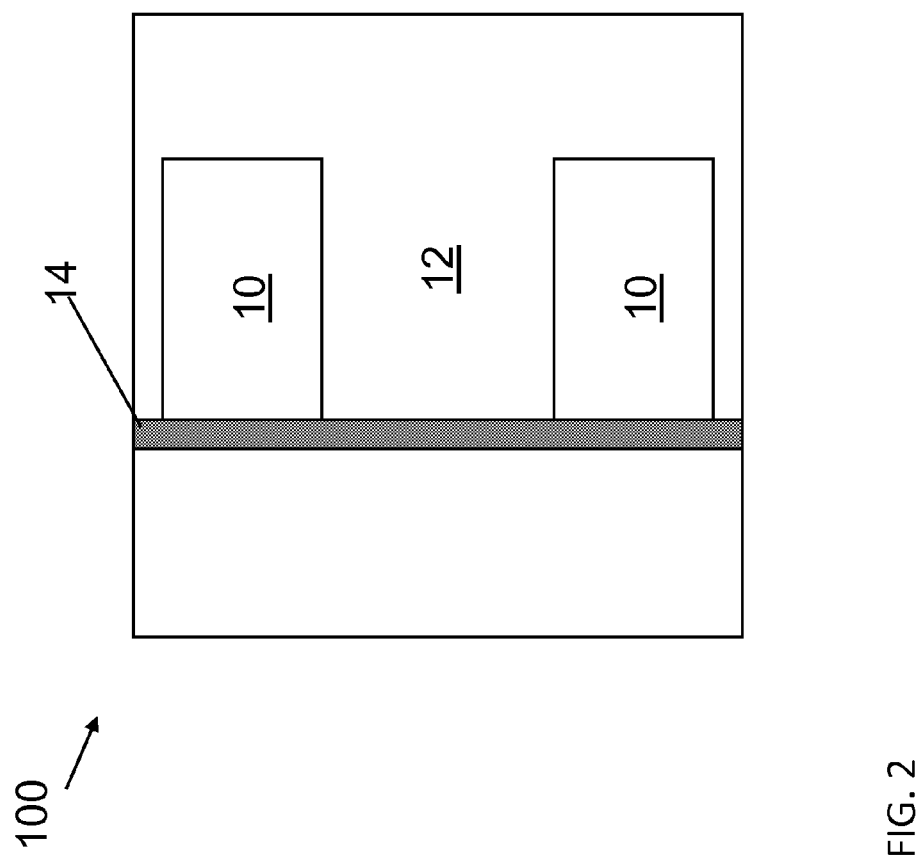
FIG. 2 shows a cross-sectional side view of portions of a semiconductor tunneling device according to embodiments of the invention.

Turning now to FIG. 2, a cross-sectional view of semiconductor tunneling device 100 according to another embodiment of the invention is shown. In contrast to semiconductor tunneling device 100 in FIG. 1, the semiconductor tunneling device 100 in FIG. 2 has been rotated 90 degree. In FIG. 1, the material of the terminals 10 laterally diffuse. In contrast, in FIG. 2, the material of the terminals 10 vertically diffuse.

Figure 3:
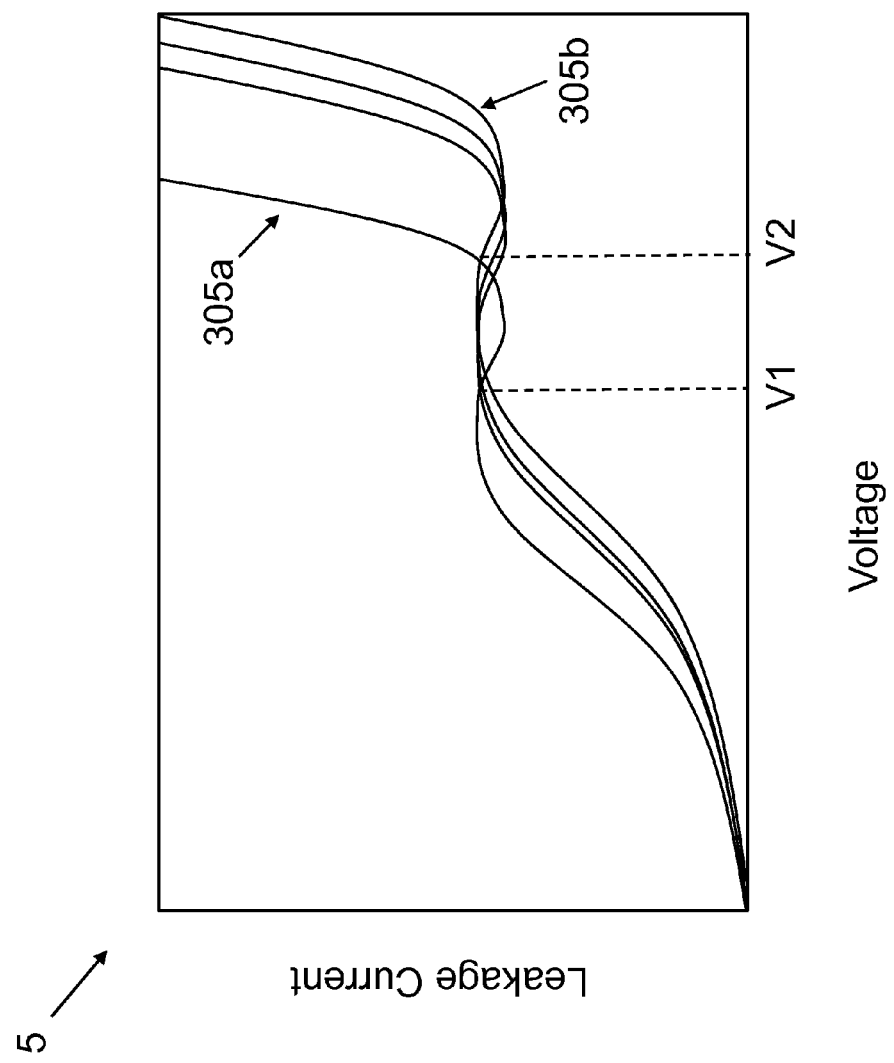
FIG. 3 shows a graph illustrating a characteristic curve of voltage and leakage current for a semiconductor tunneling device according to embodiments of the invention.

Turning now to FIG. 3, a graph 5 illustrating a characteristic curve of voltage and leakage current for semiconductor tunneling device 100 according to embodiments of the invention is shown. As voltage increases, the leakage current also increases. However, at a certain voltage, the leakage current will decrease. Following the properties of Ohm's law, the semiconductor tunneling device 100 exhibits negative resistance characteristics at this voltage. The multiple curves in graph 5 show how the spacing S between terminals 10 (FIG. 1) can change the voltage at which negative resistance characteristics occur. For example, curve 305a in graph 5 exhibits negative resistance at voltage V1, while curve 305b in graph 5 exhibits negative resistance at voltage V2. It is understood that the exact curves of this graph 5 are only for exemplary purposes only and do not limit the voltage-leakage current curve for semiconductor tunneling device 100.

Figure 4:
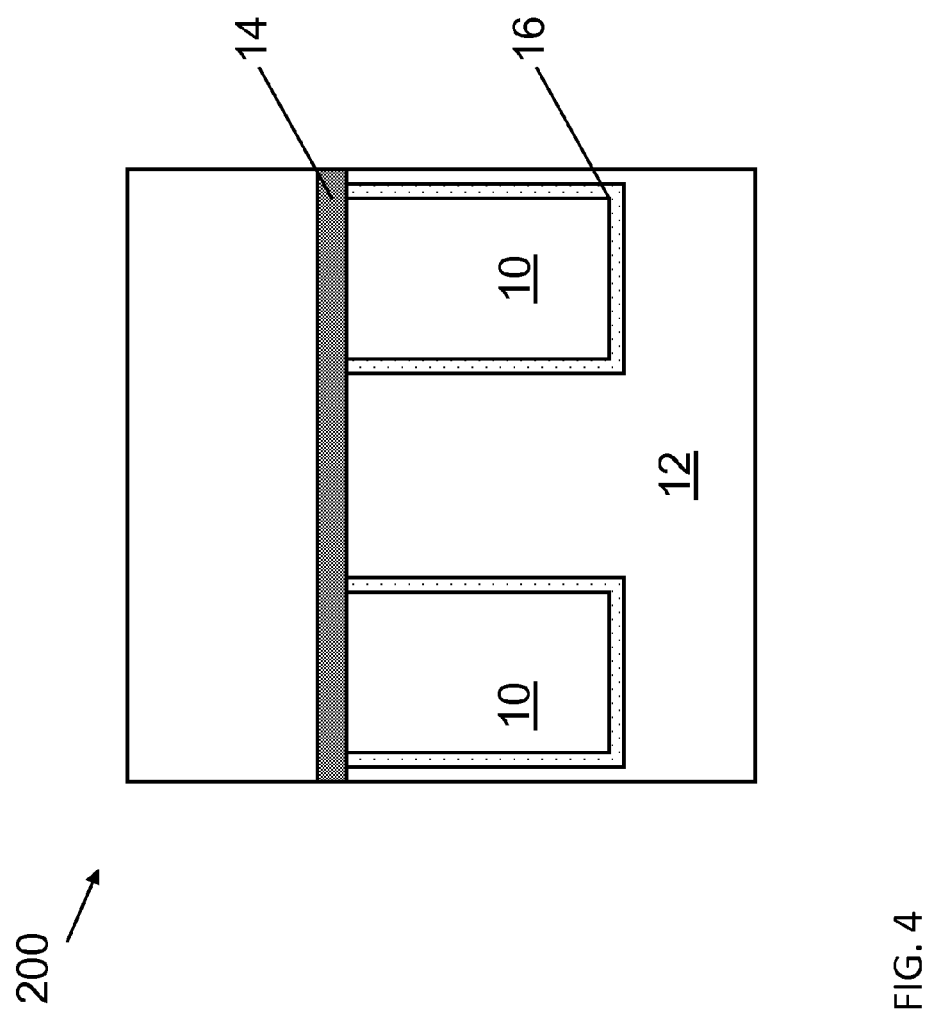
FIG. 4 shows a cross-sectional side view of portions of a semiconductor tunneling device according to embodiments of the invention.

Turning now to FIG. 4, a cross-sectional view of a semiconductor tunneling device 200 according to embodiments of the invention is shown. In this embodiment, the pair of spaced apart terminals 10 may include a liner 16. Liner 16 substantially surrounds each of the terminals 10 between terminals 10 and the ILD layer 12. The liner 16 is not provided between the terminals 10 and the dielectric capping layer 14. Liner 16 may include, for example, tantalum or tantalum nitride.

Figure 5:
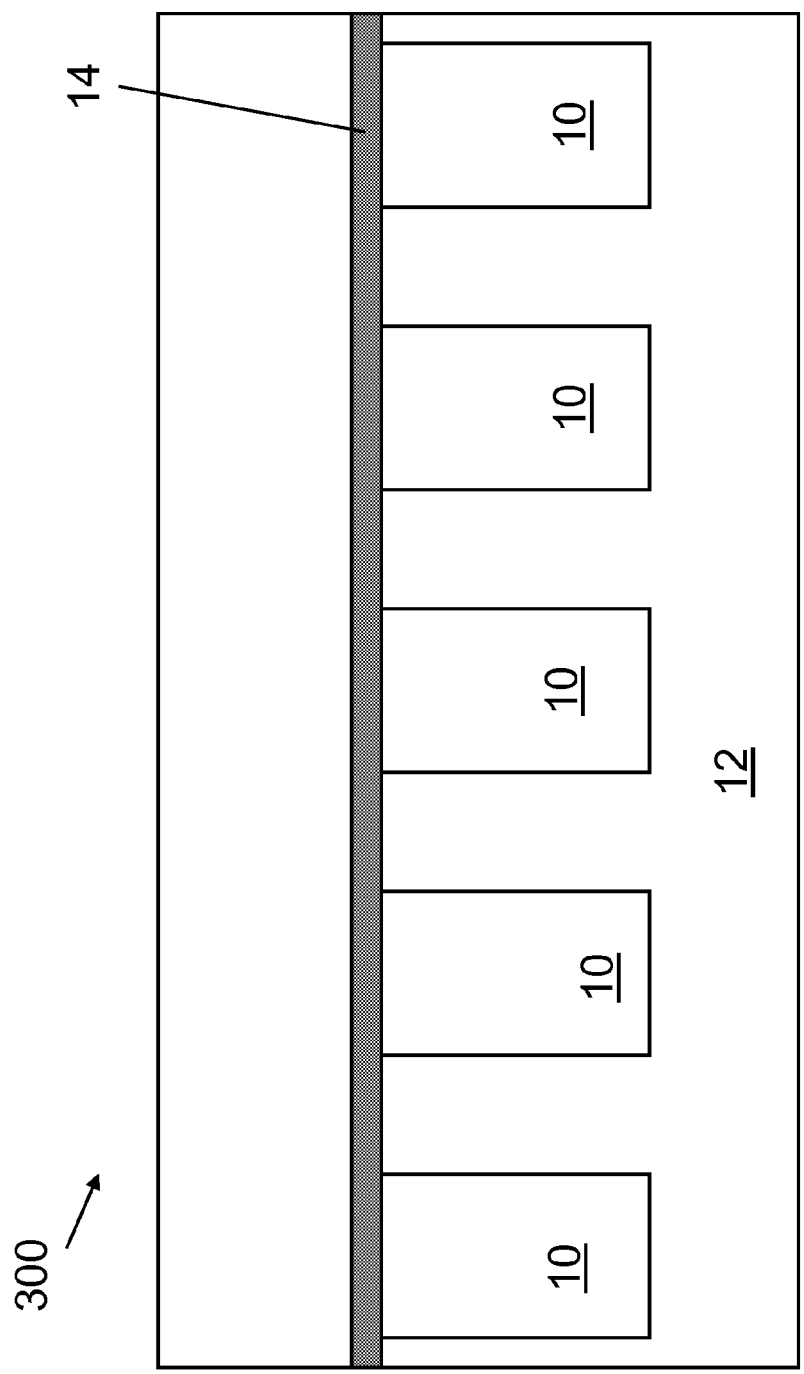
FIG. 5 shows a cross-sectional side view of portions of a semiconductor tunneling device according to embodiments of the invention.

Turning now to FIG. 5, a cross-sectional view of a semiconductor tunneling device 300 according to embodiments of the invention is shown. In this embodiment, semiconductor tunneling device 300 may include a diode array. That is, semiconductor tunneling device 300 may include a plurality of spaced apart terminals 10.

Figure 6:
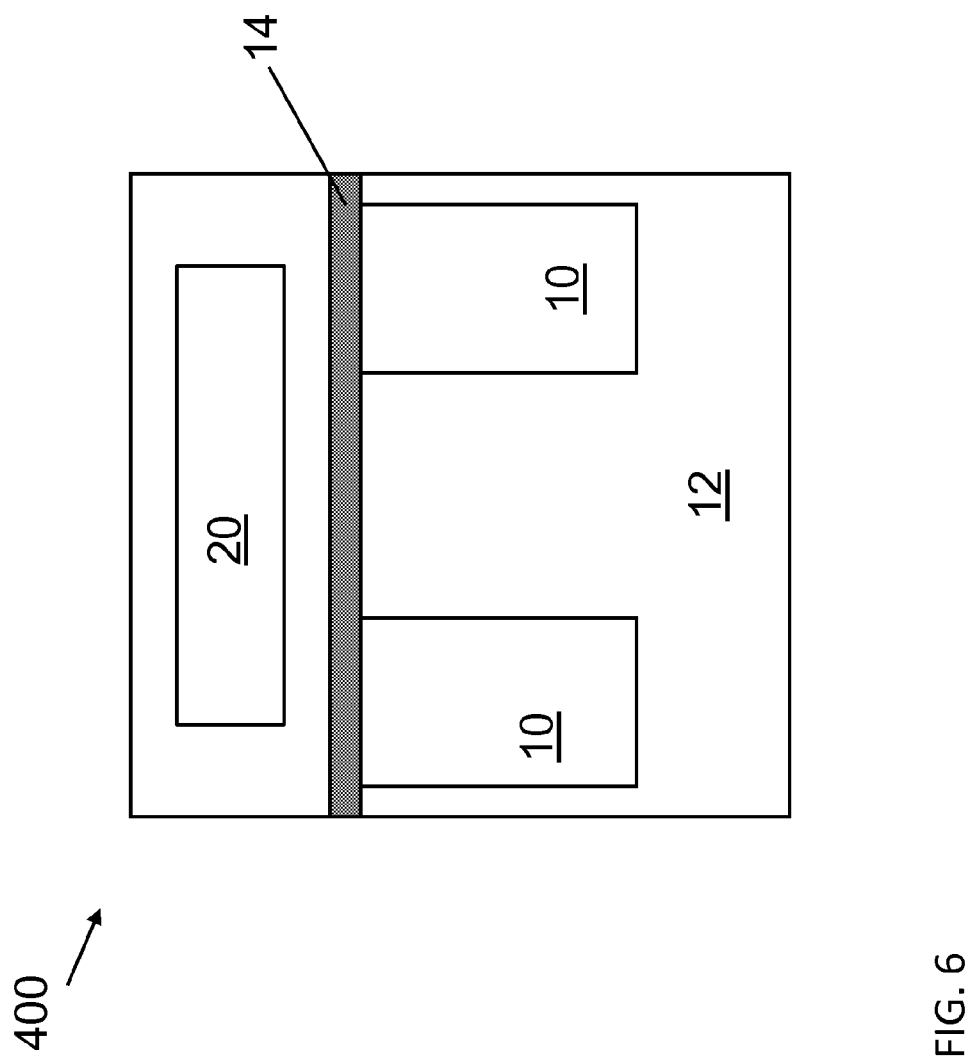
FIG. 6 shows a cross-sectional side view of portions of a semiconductor tunneling device according to embodiments of the invention.

Turning to FIG. 6, a cross-sectional view of a semiconductor tunneling device 400 according to embodiments of the invention is shown. In this embodiment, semiconductor tunneling device 400 may include a transistor. That is, a control gate 20 may be adjacent to dielectric capping layer 14.

Figure 7:
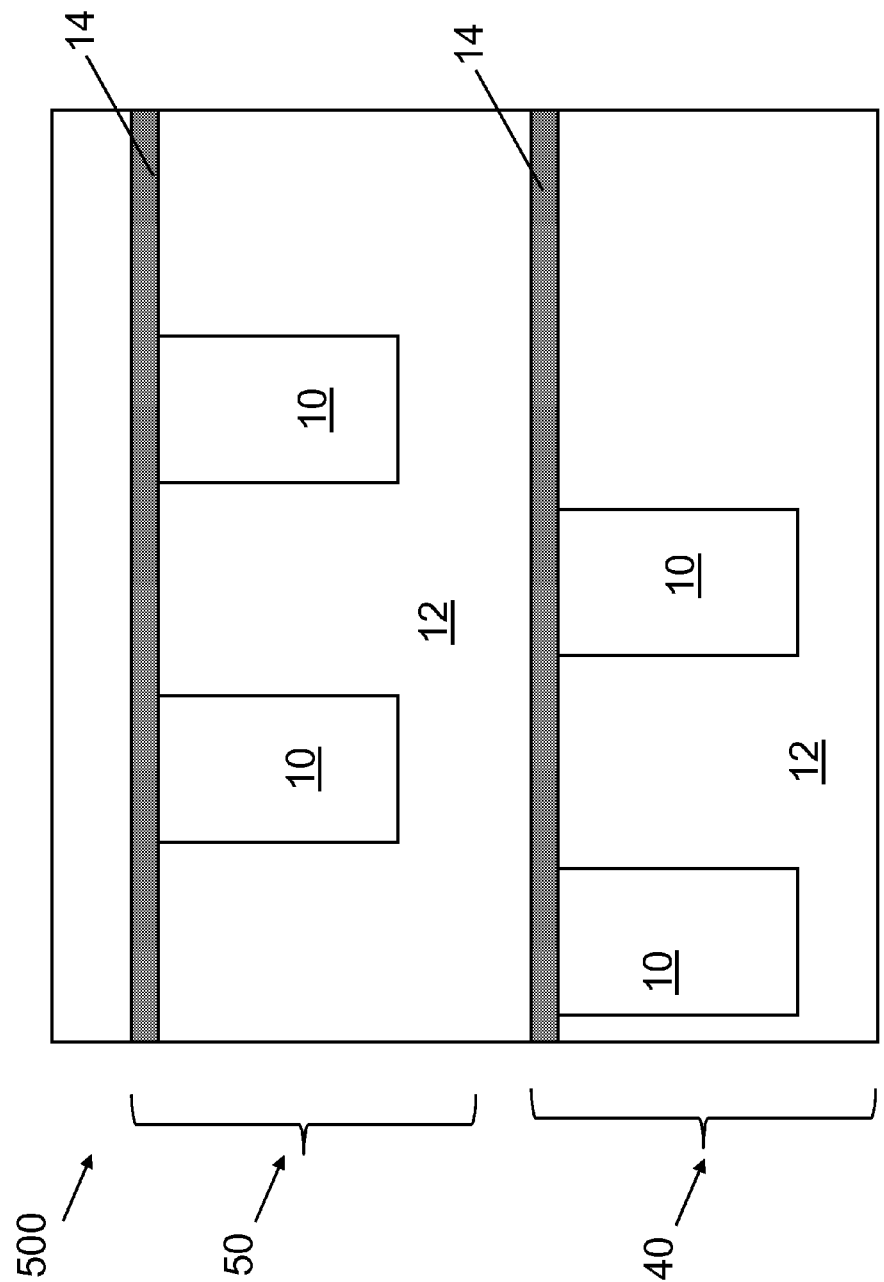
FIG. 7 shows a cross-sectional side view of portions of a semiconductor tunneling device according to embodiments of the invention.

Turning now to FIG. 7, a semiconductor tunneling device 100 (i.e., a diode) of FIG. 1 is shown in a first metal layer 40. Further, semiconductor tunneling device 100 of FIG. 1 is also shown in a second metal layer 50. That is, semiconductor tunneling device 100 is stackable. It is understood that semiconductor tunneling device 100 (FIG. 1) may be on any metal layer, or on multiple metal layers.

It is understood that semiconductor tunneling device 100, 200, 300, 400, 500 may be formed during back-end-of-line (BEOL) processing or front-end-of-line (FEOL) processing. During BEOL processing, however, the formation of semiconductor tunneling device 100, 200, 300, 400, 500 does not require a substrate.

Figure 8:
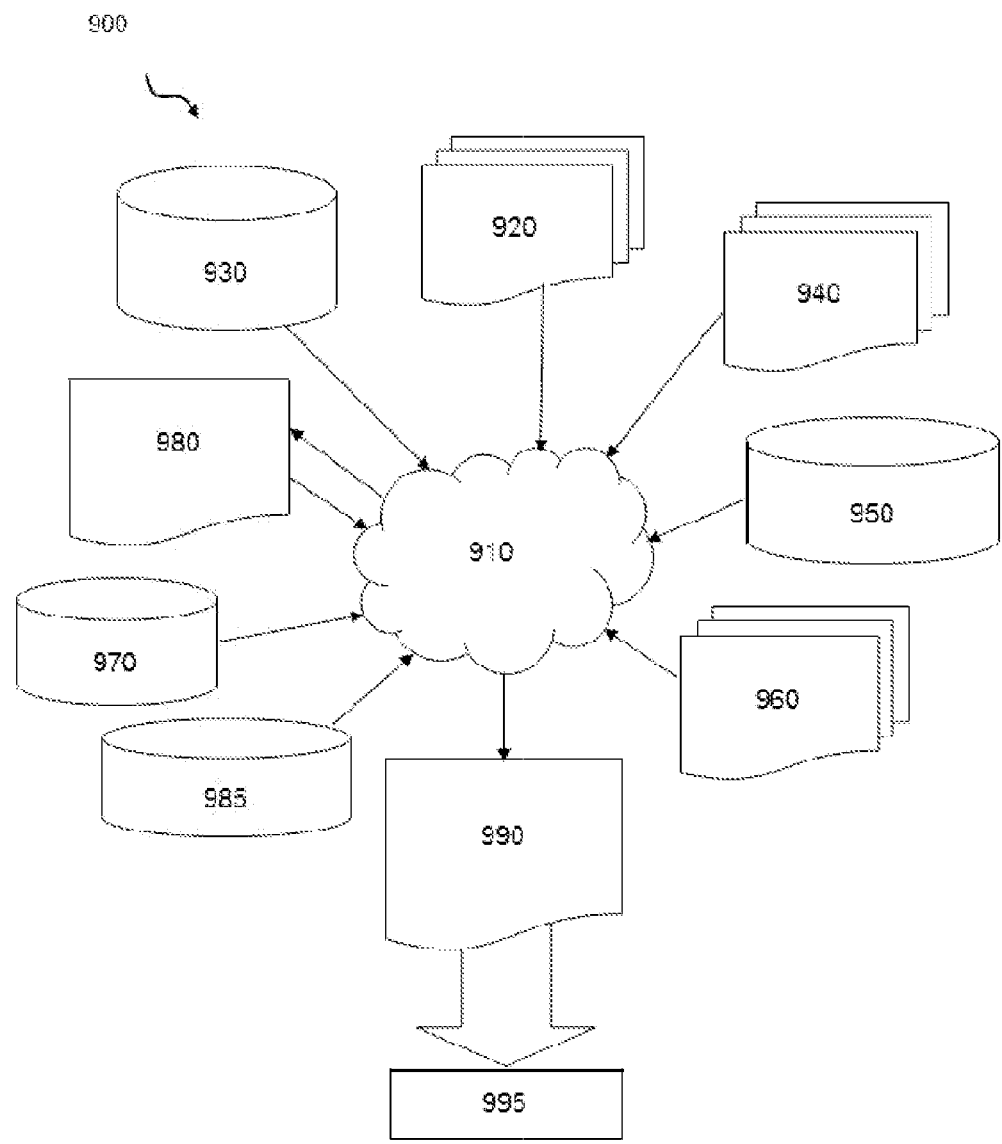
FIG. 8 is a flow diagram of a design process used in semiconductor design, manufacture, and/or test according to embodiments of the invention.

FIG. 8 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-2 and 4-7. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 8 illustrates multiple such design structures including an input design structure 920 that is preferably processed by a design process 910. Design structure 920 may be a logical simulation design structure generated and processed by design process 910 to produce a logically equivalent functional representation of a hardware device. Design structure

920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-2 and 4-7. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-2 and 4-7 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-2 and 4-7. In one embodiment, design structure 990 may comprise a compiled, executable HDL simulation model that functionally simulates the devices shown in FIGS. 1-2 and 4-7.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-2 and 4-7. Design structure 990 may then proceed to a stage 995 where, for example, design structure 990: proceeds to tape-out, is released to manufacturing, is released to a mask house, is sent to another design house, is sent back to the customer, etc.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A semiconductor tunneling device, comprising:
    at least one pair of spaced apart terminals;
    an inter-level dielectric (ILD) layer between the at least one pair of spaced apart terminals; and
    a dielectric capping layer extending continuously over the at least one pair of spaced apart terminals and the ILD layer.

2. The semiconductor tunneling device of claim 1, wherein each of the terminals includes copper.

3. The semiconductor tunneling device of claim 1, wherein the dielectric capping layer includes hydrogen doped silicon carbide.

4. The semiconductor tunneling device of claim 1, wherein a thickness of the dielectric capping layer is approximately 2 nanometers to approximately 5 nanometers.

5. The semiconductor tunneling device of claim 1, wherein the semiconductor tunneling device includes a diode array comprising a plurality of spaced apart terminals.

6. The semiconductor tunneling device of claim 1, wherein the semiconductor tunneling device includes a transistor.

7. The semiconductor tunneling device of claim 1, further comprising a liner between each terminal and the ILD layer.

8. The semiconductor tunneling device of claim 1, further comprising a second pair of spaced apart terminals, wherein a first pair of spaced apart terminals is in a first metal layer and the second pair of spaced apart terminals is in a second metal layer.

9. A semiconductor tunneling device, comprising:
    at least one pair of spaced apart copper terminals;
    an inter-level dielectric (ILD) layer between the at least one pair of spaced apart terminals; and
    a hydrogen doped silicon carbide capping layer extending continuously over the at least one pair of spaced apart terminals and the ILD layer.

10. The semiconductor tunneling device of claim 9, wherein a thickness of the hydrogen doped silicon carbide capping layer is approximately 2 nanometers to approximately 5 nanometers.

11. The semiconductor tunneling device of claim 9, wherein the semiconductor tunneling device includes a diode array comprising a plurality of spaced apart copper terminals.

12. The semiconductor tunneling device of claim 9, wherein the ILD layer includes a low-k dielectric material with a dielectric constant of approximately less than 4.

13. The semiconductor tunneling device of claim 9, wherein the semiconductor tunneling device includes a transistor.

14. The semiconductor tunneling device of claim 9, further comprising a liner between each terminal and the ILD layer.

15. The semiconductor tunneling device of claim 9, further comprising a second pair of spaced apart terminals, wherein a first pair of spaced apart terminals is in a first metal layer and the second pair of spaced apart terminals is in a second metal layer.

16. A design structure tangibly embodied in a machine readable medium for designing, manufacturing, or testing an integrated circuit, the design structure comprising:
    at least one pair of spaced apart copper terminals;
    an inter-level dielectric (ILD) layer between the at least one pair of spaced apart terminals; and
    a dielectric capping layer extending continuously over the at least one pair of spaced apart terminals and the ILD layer.

17. The design structure of claim 16, further comprising a liner between each terminal and the ILD layer.

18. The design structure of claim 16, further comprising a second pair of spaced apart copper terminals, wherein a first pair of spaced apart terminals is in a first metal layer and the second pair of spaced apart terminals is in a second metal layer.

19. The design structure of claim 16, wherein the design structure comprises a netlist.

20. The design structure of claim 16, wherein the design structure resides on storage medium as a data format used for the exchange of layout data of integrated Circuit.

* * * * *